(12) United States Patent
Siu et al.

(10) Patent No.: US 9,357,604 B2
(45) Date of Patent: May 31, 2016

(54) LIGHT ENGINE WITH LED SWITCHING ARRAY

(75) Inventors: Kam Wah Siu, Tsing Yi (HK); Wa Hing Leung, Hong Kong (CN)

(73) Assignee: Huizhou Light Engine Ltd., Guangdong (CN)

( * ) Notice: Subject to any disclaimer, the term of this patent is extended or adjusted under 35 U.S.C. 154(b) by 30 days.

(21) Appl. No.: 13/585,463

(22) Filed: Aug. 14, 2012

(65) Prior Publication Data
US 2013/0043799 A1    Feb. 21, 2013

Related U.S. Application Data

(60) Provisional application No. 61/524,163, filed on Aug. 16, 2011.

(51) Int. Cl.
*H05B 37/02* (2006.01)
*H05B 33/08* (2006.01)

(52) U.S. Cl.
CPC ........ *H05B 33/0824* (2013.01); *H05B 33/0803* (2013.01); *H01L 2224/48137* (2013.01); *H01L 2224/48472* (2013.01); *H01L 2224/73265* (2013.01); *H01L 2924/13091* (2013.01); *H01L 2924/30107* (2013.01)

(58) Field of Classification Search
CPC ........... H05B 33/0815; H05B 33/0818; H05B 37/029; H05B 41/3925; H05B 41/2828; H05B 33/0803
USPC ........... 315/193, 169.3; 345/694, 74, 82, 102; 257/738; 357/65
See application file for complete search history.

(56) References Cited

U.S. PATENT DOCUMENTS

| | | | | |
|---|---|---|---|---|
| 5,153,704 | A * | 10/1992 | Onuki et al. | 257/784 |
| 7,019,721 | B2 * | 3/2006 | Thielemans et al. | 345/82 |
| 7,148,632 | B2 * | 12/2006 | Berman et al. | 315/189 |
| 7,423,626 | B2 * | 9/2008 | Yamamoto et al. | 345/102 |

(Continued)

FOREIGN PATENT DOCUMENTS

| | | |
|---|---|---|
| CN | 2757488 Y | 2/2006 |
| CN | 201114877 Y | 9/2008 |

(Continued)

OTHER PUBLICATIONS

Mar. 18, 2014 Office Action for Chinese Patent Application No. 201110270950.2 (with English translation).

(Continued)

*Primary Examiner* — Douglas W Owens
*Assistant Examiner* — Syed M Kaiser
(74) *Attorney, Agent, or Firm* — Schiff Hardin LLP

(57) ABSTRACT

An LED array switching apparatus comprises, on a single PCB substrate: a plurality of LED arrays D1 to Dn connected in series, each LED array having a forward voltage; an AC voltage supply coupled to the plurality of LED arrays; and a plurality of constant current sources G1 to Gn, coupled to outputs of LED arrays D1 to Dn, respectively, each of the constant current sources being switchable between a current regulating state and an open state such that as the voltage of the AC voltage supply increases, LED arrays are switched on and lit to form a higher forward voltage LED string, and as the voltage of the AC voltage supply decreases, LED arrays are switched off and removed from the LED string starting with the most recently lit LED array.

16 Claims, 11 Drawing Sheets

(56) References Cited

U.S. PATENT DOCUMENTS

| | | | |
|---|---|---|---|
| 7,560,677 B2* | 7/2009 | Lyons et al. | 250/205 |
| 8,058,810 B2* | 11/2011 | Chen et al. | 315/209 R |
| 8,081,199 B2* | 12/2011 | Takata et al. | 345/694 |
| 8,405,321 B2* | 3/2013 | Omi | 315/294 |
| 8,638,045 B2* | 1/2014 | Kunst et al. | 315/291 |
| 8,754,590 B2* | 6/2014 | Makino et al. | 315/307 |
| 2004/0105264 A1 | 6/2004 | Spero | |
| 2004/0233145 A1 | 11/2004 | Chiang | |
| 2005/0093792 A1* | 5/2005 | Yamamoto et al. | 345/83 |
| 2006/0038542 A1 | 2/2006 | Park et al. | |
| 2007/0257623 A1 | 11/2007 | Johnson et al. | |
| 2008/0123340 A1 | 5/2008 | McClellan | |
| 2009/0295776 A1* | 12/2009 | Yu et al. | 345/212 |
| 2010/0065963 A1* | 3/2010 | Eldridge et al. | 257/734 |
| 2010/0283397 A1* | 11/2010 | Chen et al. | 315/192 |
| 2010/0301372 A1* | 12/2010 | Loh | 257/98 |
| 2010/0328370 A1* | 12/2010 | Takata et al. | 345/694 |
| 2011/0084619 A1 | 4/2011 | Gray et al. | |
| 2011/0316132 A1* | 12/2011 | Pagaila et al. | 257/676 |
| 2011/0316156 A1* | 12/2011 | Pagaila et al. | 257/738 |
| 2012/0038285 A1* | 2/2012 | Leung et al. | 315/193 |
| 2014/0103812 A1* | 4/2014 | Roberts et al. | 315/151 |

FOREIGN PATENT DOCUMENTS

| | | |
|---|---|---|
| CN | 101772245 A | 7/2010 |
| CN | 201666494 U | 12/2010 |
| CN | 101990715 A | 3/2011 |
| CN | 202203727 U | 4/2012 |
| EP | 2448013 A1 | 5/2012 |
| JP | 2007200577 A | 8/2007 |

OTHER PUBLICATIONS

Office Action dated Jul. 24, 2014 for Chinese Patent Application 201110270950.2.

Supplementary European Search Report dated Mar. 24, 2015 for European Patent Application No. 12824625.3.

Office Action dated Feb. 9, 2016 for European Patent Application No. 12824625.3.

Baldwin D.F, et al., "Thermal Dissipation Analysis in Flip Chip on Board and Chip on Board Assemblies", Electronic Components & Technology Conference, 1998,48th IEEE Seattle, WA, USA May 25-28, 1998, New York NY, USA IEEE, US May 25, 1998), pp. 76-86, XP010283731.

* cited by examiner

LIGHT ENGINE WITH LED SWITCHING ARRAY

CROSS-REFERENCE TO RELATED APPLICATIONS

This utility application claims the benefit under 35 U.S.C. §119(e) of U.S. Provisional Patent Application No. 61/524,163, filed Aug. 16, 2011, the entirety of which is incorporated herein by reference.

BACKGROUND OF THE INVENTION

The present invention generally relates to improved methods and apparatuses for driving light emitting diodes ("LEDs"), such as those used in LED lamps and lighting fixtures, and improved methods and apparatus for driving that facilitate locating driving circuitry and the LEDs together on a single package.

Typically, the use of LEDs as an AC powered light source requires a driver to convert AC line power to a regulated DC power for maintaining constant light output. Such an LED driver is a self-contained power supply that has output matched to the electrical characteristics, such as forward voltage and driving current, of the LED. Usually, the driver is built on an individual PCB and connects to an LED PCB which contains the array of LEDs.

FIG. 1 shows typical circuitry of an AC-DC LED driver using the known flyback converter topology. The circuitry 10 includes an AC power source 12 with live (L) and neutral (N) terminals, and a rectifier circuit 14 that converts the AC, e.g., sinusoidal, input waveform to a DC waveform, e.g., a half wave rectified waveform. The circuit operates such that when the switch Q1 conducts, current is directly drawn from the rectified sinusoid. Energy is stored in the magnetizing inductance of the primary winding of transformer T1. The rectifying Zener diode D1 is reverse biased and the LED current is supplied by the secondary capacitor Cout. When Q1 turns off, diode D1 conducts and the stored energy is delivered to the secondary winding of transformer T1 and to the output. The controller chip U1, which can be, for example an iW3620 Digital PWM Constant Current Controller for AC/DC LED Driver, manufactured by iWatt, Inc., regulates the LED current by comparing the information about the secondary output voltage and LED current, which information is reflected via the auxiliary winding of transformer T1, to a constant reference and, based on the comparison, adjusting the duty cycle of switch Q1.

AC-DC drivers such as the one shown in FIG. 1 are complex and bulky circuits. With the goal of making a simpler circuit, LED manufacturers have developed an AC LED circuit, which is basically LED lighting circuitry that can operate on AC power without the need for the complex AC-DC driver of the type shown in FIG. 1. However, the AC line voltage is sinusoidal and the majority of low frequency AC LED systems operate in the rectified mode, which turns off the AC LED at a rate of double the line frequency.

FIG. 2 is a schematic of a conventional AC LED circuit. In such a circuit, the LEDs can be driven directly by the AC power source 102 without the use of a complex converter. In operation of the illustrated circuit, during the positive half cycle of the, e.g., sinusoidal, AC source V, LED string S2 is reverse biased and LED string S1 is conducting and emitting light. During the negative half cycle of AC source V, LED string S1 is reverse biased and LED string S2 is conducting and emitting light. The forward voltages of LED strings S1 and S2 are equal. The resistor R limits the current through the LED strings S1 and S2.

FIG. 3 shows the light output (i.e., luminous flux vs. time) of an AC LED circuit. It can be seen from the figure that the off-time in such a circuit is about 40%, due to the fact that the LED current of the AC LED circuit is discontinuous at the zero crossing of the AC voltage waveform. Since the rectified AC line voltage cycles from zero to peak level and back to zero, the LED string turns off whenever the line voltage level falls below the forward voltage of the LED string.

BRIEF SUMMARY OF THE INVENTION

In accordance with an aspect of the present invention, an LED array switching apparatus comprises, on a single PCB substrate: a plurality of LED arrays D1 to Dn connected in series, each LED array having a forward voltage; an AC voltage supply coupled to the plurality of LED arrays; and a plurality of constant current sources G1 to Gn, coupled to outputs of LED arrays D1 to Dn, respectively, each of the constant current sources being switchable between a current regulating state and an open state such that as the voltage of the AC voltage supply increases, LED arrays are switched on and lit to form a higher forward voltage LED string, and as the voltage of the AC voltage supply decreases, LED arrays are switched off and removed from the LED string starting with the most recently lit LED array.

In another aspect, the plurality of LED arrays and the plurality of constant current sources are formed as semiconductor chips, and the semiconductor chips are affixed to the PCB substrate by direct chip attachment (DCA).

In another aspect, the semiconductor chips are affixed to the PCB substrate using thermal adhesive.

In another aspect, an electrical connection between the semiconductor chips and the PCB substrate is provided by bond wiring.

In another aspect, the bond wiring is by thermosonic Au ball bonding.

In another aspect, the bond wiring is by ultrasonic Al wedge bonding.

In another aspect, the LED array switching apparatus further comprises an encapsulant encapsulating at least the semiconductor chips.

In another aspect, LEDs of a particular array are placed next to LEDs of other arrays.

In another aspect, the PCB substrate area for placing semiconductor chips for the LED arrays and the PCB substrate area for placing semiconductor chips for constant current sources are set in proportion to the amount of heat dissipated by the respective types of semiconductor chips.

In another aspect, the PCB substrate is formed from a material in the group consisting of ceramic, glass, organic and flex substrates.

BRIEF DESCRIPTION OF THE DRAWINGS

The figures are for illustration purposes only and are not necessarily drawn to scale. The invention itself, however, may best be understood by reference to the detailed description which follows when taken in conjunction with the accompanying drawings in which.

DETAILED DESCRIPTION OF THE INVENTION

Figure 1:
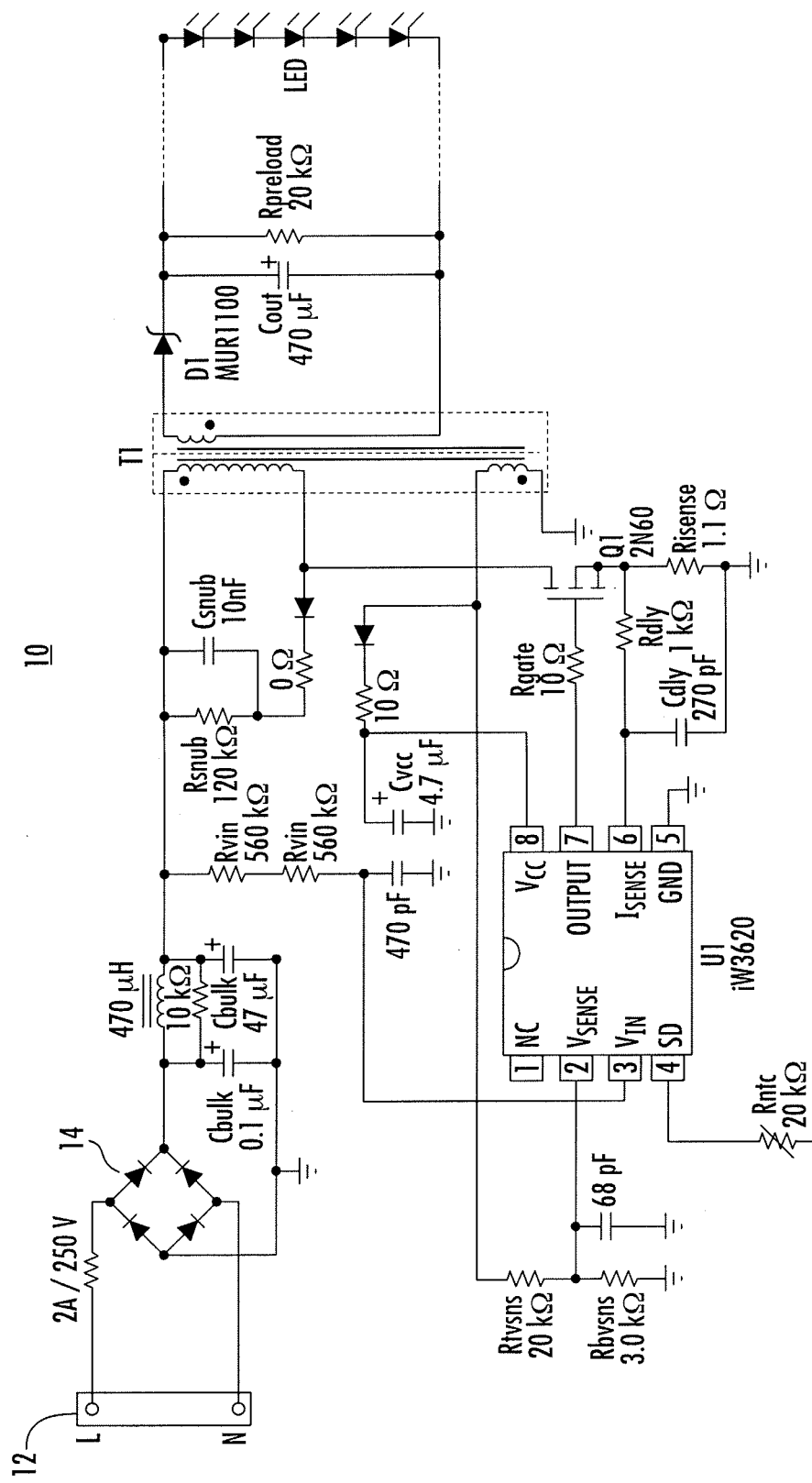
FIG. 1 is a diagram of conventional circuitry of an AC-DC LED driver.
Figure 2:
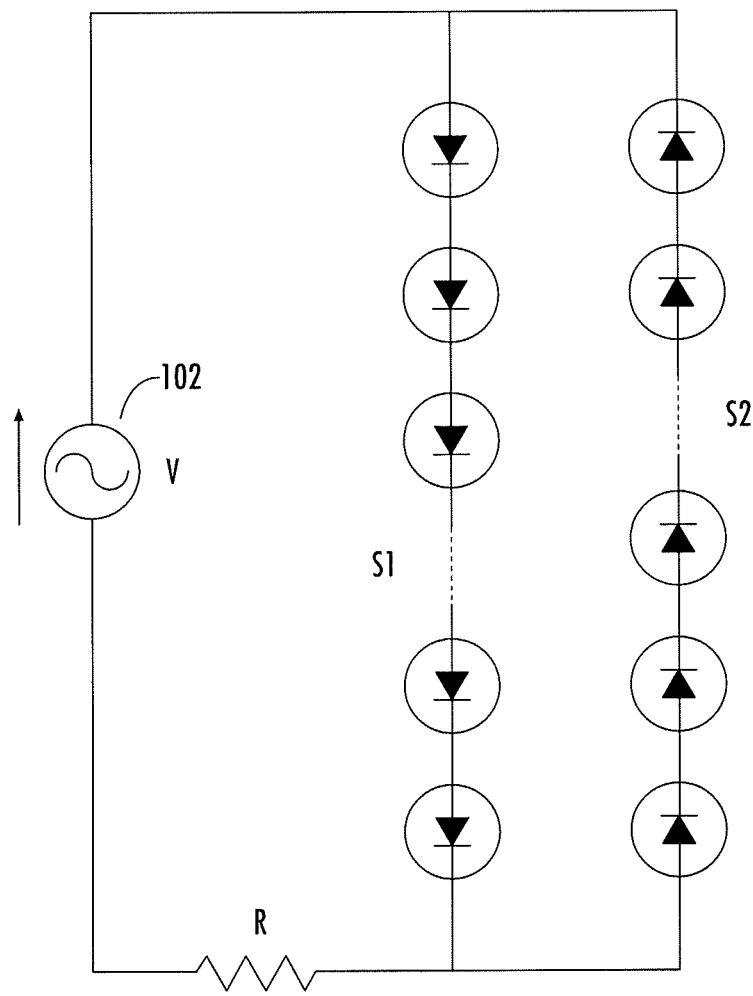
FIG. 2 is schematic diagram of a conventional AC LED circuit.
Figure 3:
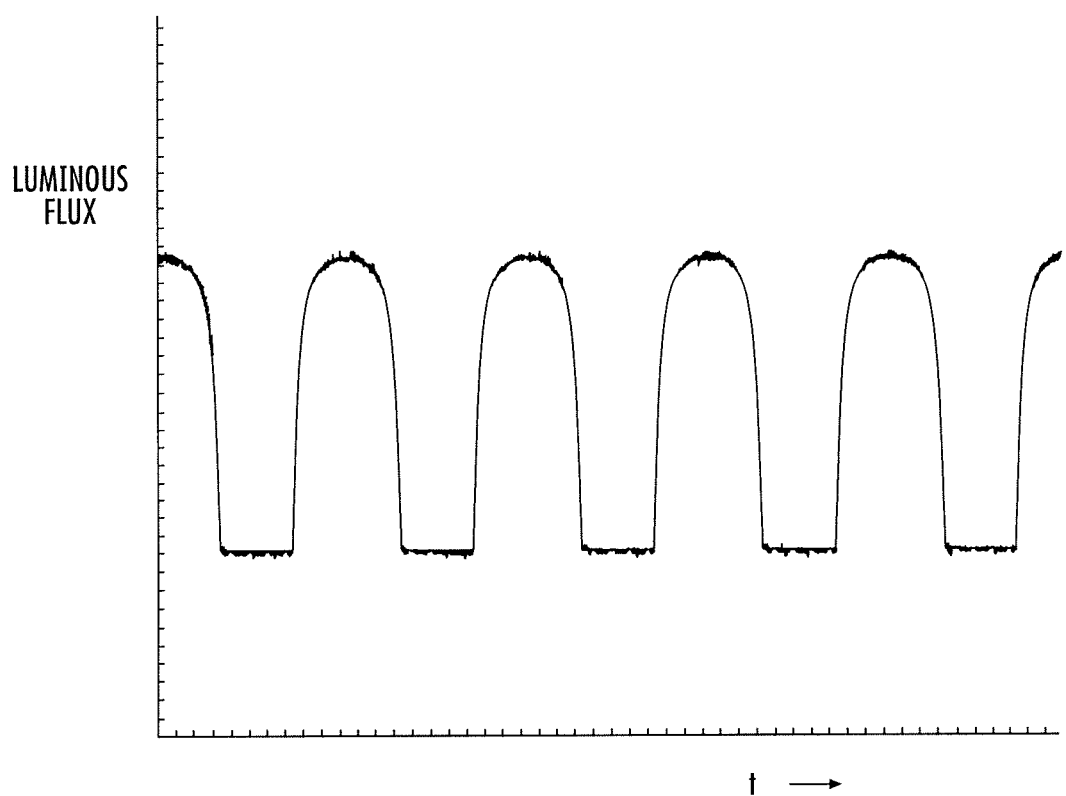
FIG. 3 is light output waveform of an AC LED circuit such as the one shown in FIG. 2.

In order to retain the simple AC connection of an AC LED circuit design, while reducing light off-time associated with conventional AC LED circuits, in accordance with aspects of the present invention, an AC light engine is built on a single PCB with multiple LED arrays and switchable current sources. In contrast to conventional AC-DC LED drivers, such as the one shown in FIG. 1, which are complex and bulky, a driving circuit in accordance with the present invention is simple and small in size, allowing it be packed together with LEDs on a single PCB to form a light engine. The switching configuration in accordance with the present invention can be powered by AC mains directly, and is simple and small enough to pack with the LEDs to form a LED light engine/module which can be powered directly from the AC line. In accordance with the present invention, the driving circuit and the LEDs can be put together on a single PCB.

Figure 4:
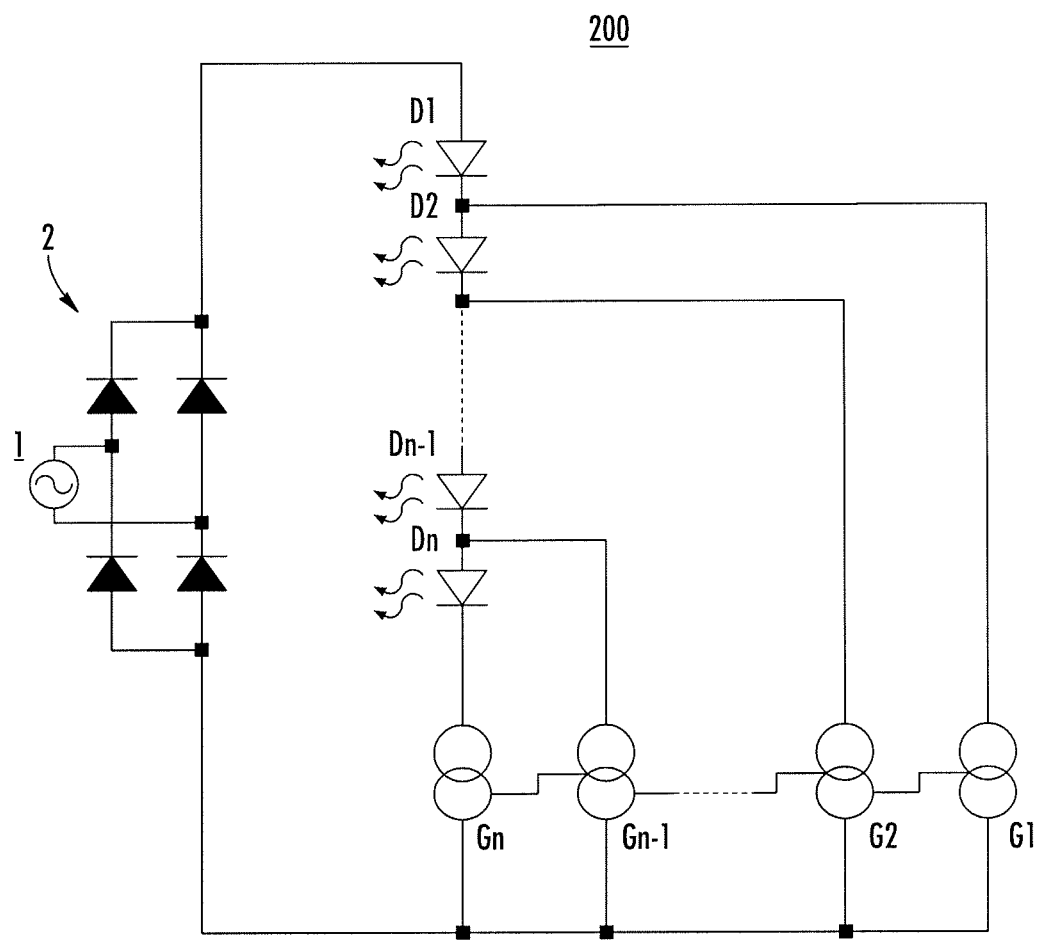
FIG. 4 is functional block diagram of a driving circuit in accordance with an aspect of the present invention.

FIG. 4 shows the functional blocks of proposed LED driving circuitry 200 in accordance with an aspect of the present invention. The circuit 200 uses a string of LEDs and the LED string is divided into n LED arrays D1 to Dn, where n>1. Each LED array may include one or more LEDs. AC source 1 supplies an AC waveform to diode array 2, which acts as a rectifier. G1 to Gn are constant current sources which can be disabled (i.e., changed to an open circuit condition) by successive current sources.

Figure 5A:
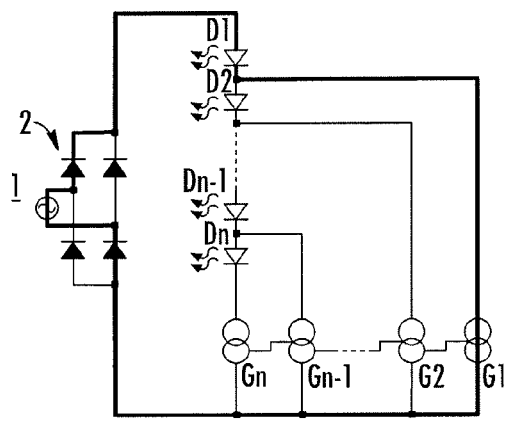
FIGS. 5A to 5F are diagrams that show different stages of switching of the circuitry of FIG. 4 in response to an input waveform.
Figure 5B:
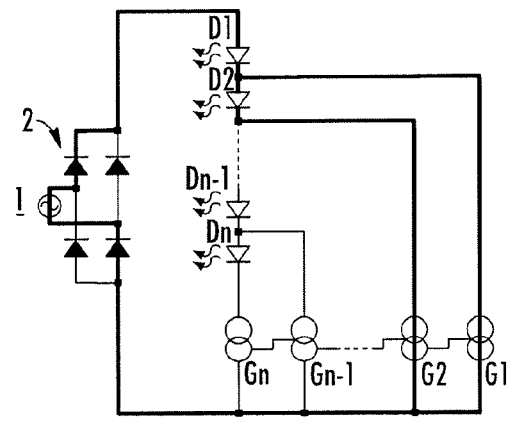
Figure 5C:
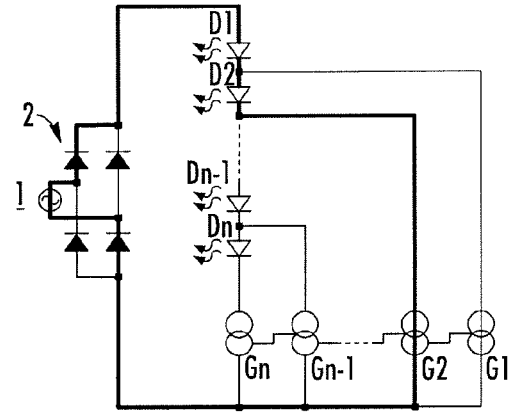
Figure 5D:
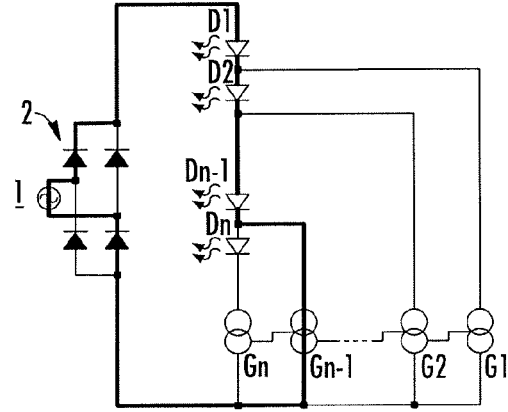
Figure 5E:
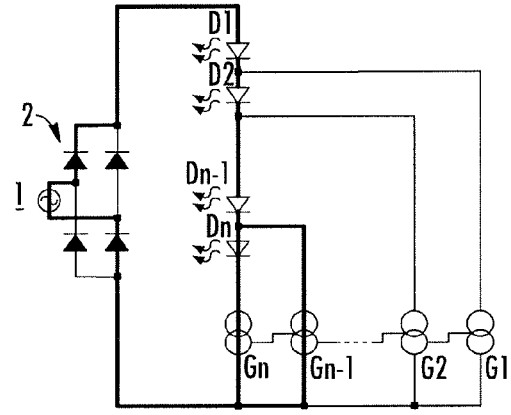
Figure 5F:
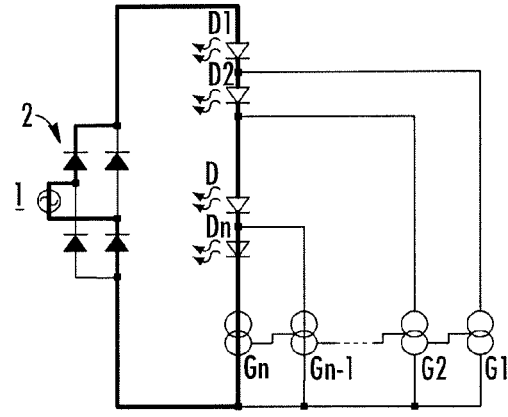

The operation of the circuit is next shown making reference to FIGS. 5A-5F for the case in which the voltage of AC source voltage is ramping up from zero. When the rectified voltage is just above the forward voltage of LED array D1, current begins to flow through LED array D1 and current source G1, as shown in FIG. 5A. Current source G1 regulates the current through LED array D1 as the rectified voltage is further increased. LED array D2 begins to conduct when the rectified voltage reaches the sum of the forward voltages of LED arrays D1 and D2, as shown in FIG. 5B. As the current through LED array D2 and current source G2 increases to the regulated value, the current through LED array D1 and current source G1 decreases to zero. The current through LED arrays D1 and D2 is then regulated by current source G2, as shown in FIG. 5C. FIG. 5D shows the current path when the rectified voltage is increased to a point where current source Gn−1 regulates the current through LED arrays D1 to Dn−1. Further increasing the rectified voltage causes LED array Dn to conduct, as shown in FIG. 5E. FIG. 5F shows the current path when the current through LED array Dn and current source Gn is increased to keep current sources G1 and Gn−1 to an open condition.

As would be understood by one of skill in the art, the switching sequence shown in FIGS. 5A-5F would be reversed if the rectified voltage is declining. In particular, the situation in which the rectified voltage is high enough to pass a regulated current through LED arrays D1 to Dn and current source Gn is shown in FIG. 5F. As the rectified voltage is decreased, the current through current source Gn starts to decrease and current begins to flow through current source Gn−1, as shown in FIG. 5E. When the rectified voltage decreases to a value below the sum of forward voltage sum of LED arrays D1 to Dn, current through LED array Dn is stopped, as shown in FIG. 5D. The same pattern would repeat in a second half wave of the rectified signal.

Figure 6:
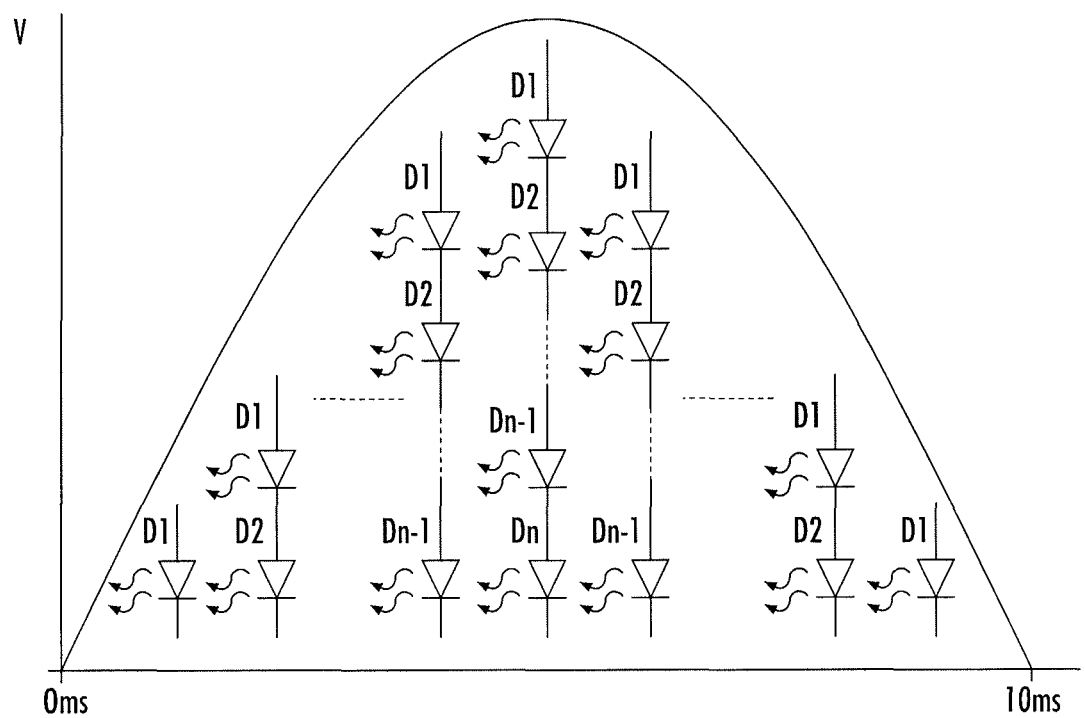
FIG. 6 shows the LED arrays that are conducting during a half AC cycle in accordance with the stages of switching of the circuitry shown in FIGS. 5A to 5F.

FIG. 6 is a diagram that illustrates the forward voltage string that is created during one half cycle, in accordance with the circuit shown in FIG. 4. As can be seen in the figure, the forward voltage string initially includes LED array D1 only. As the voltage of the voltage supply 1 approaches its peak, the forward voltage string includes LED arrays D1-Dn, and then, as the voltage of the voltage supply decreases, the length of the forward voltage string is again reduced to D1.

Figure 7:
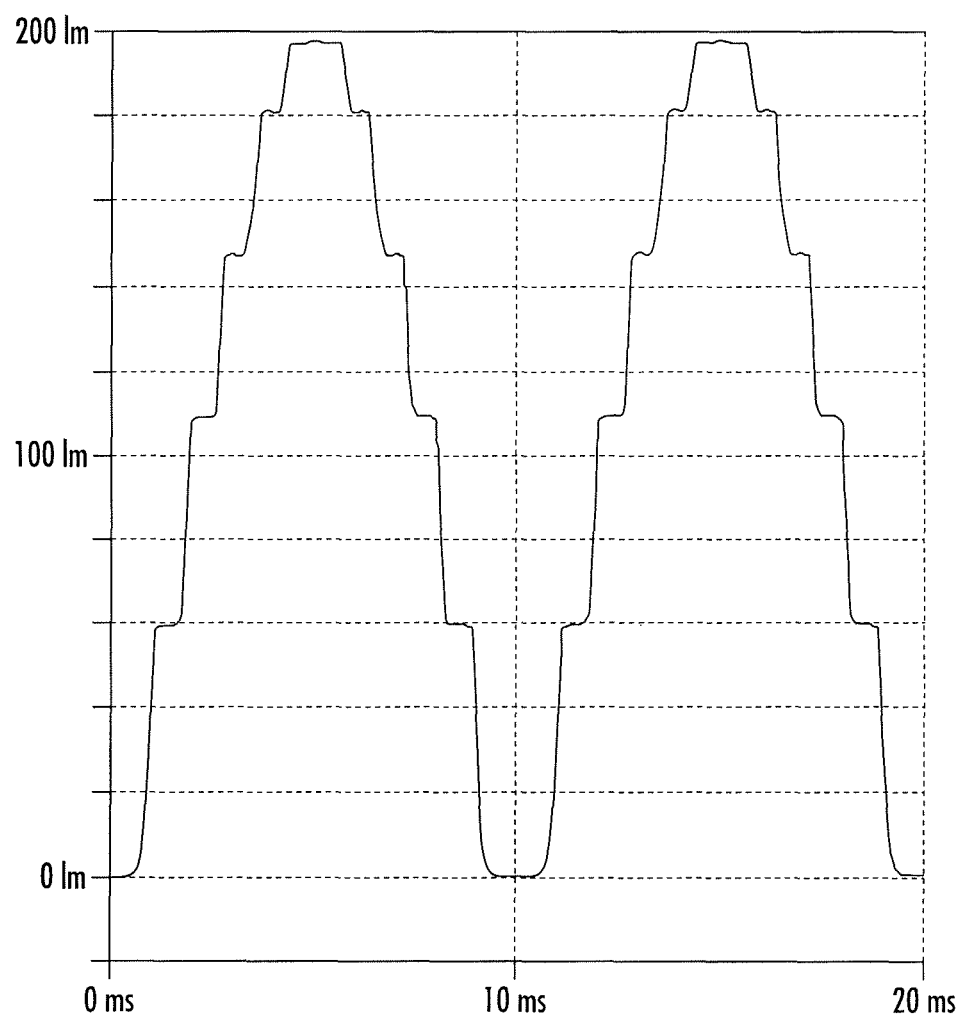
FIG. 7 shows the light output waveform of the circuit in accordance with the present invention.

FIG. 7 shows the light output waveform of the proposed LED driving circuit with the LED strings divided into 5 arrays (i.e., n=5) with forward voltage of ratio of the arrays of 5:4:3:2:1. As can be seen from the waveform, the off-time is reduced to 10% using this configuration.

Figure 8:
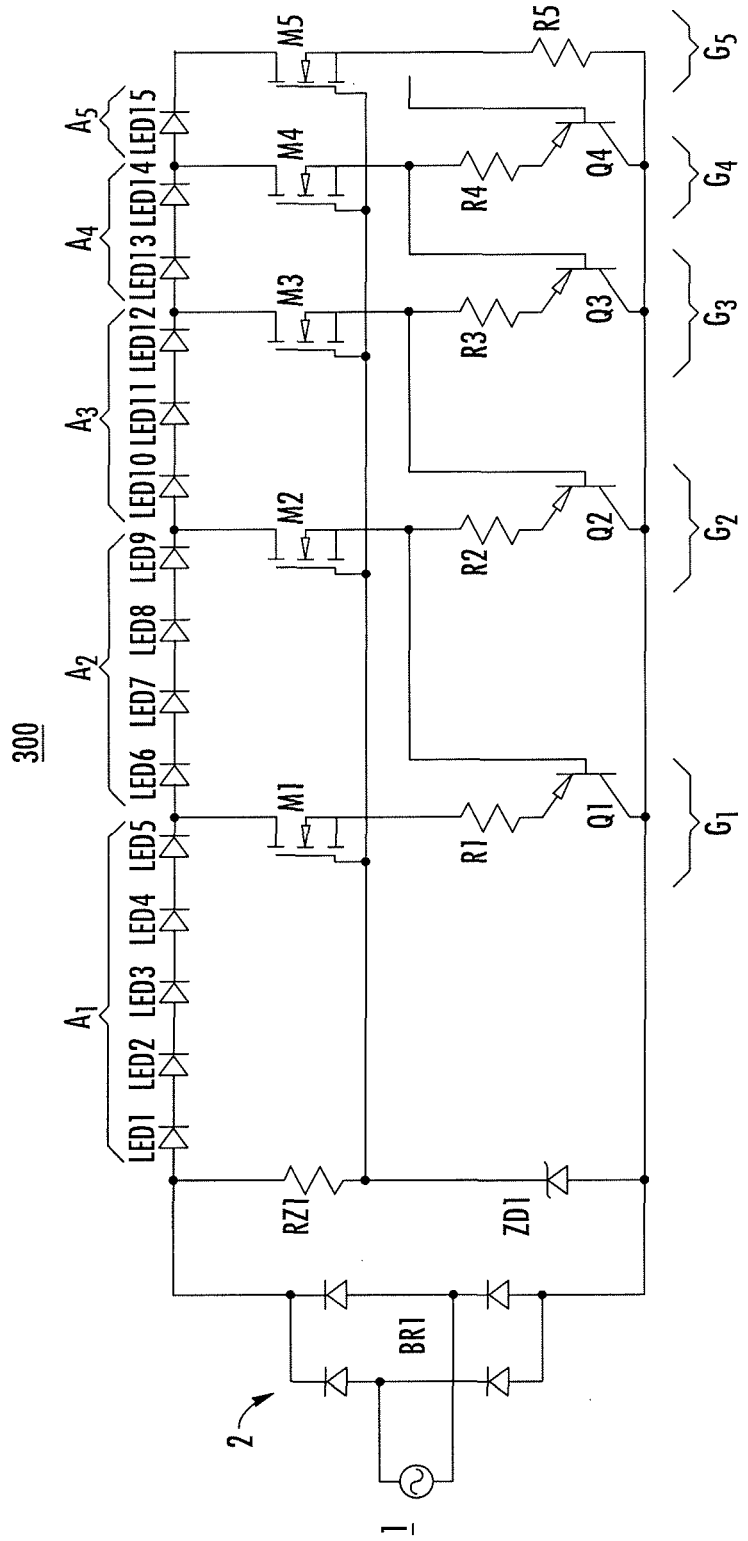
FIG. 8 is a schematic diagram of a proposed detailed implementation of the circuit in accordance with an aspect of the present invention, using packaged LEDs.

FIG. 8 shows the schematic of the proposed circuit implemented using 15 packaged LEDs divided into 5 arrays, A1 to A5, in accordance with the present invention. Resistor RZ1 and zener diode ZD1 provide a constant reference voltage for five current sources, G1 to G5. Mosfet M1, resistor R1 and transistor Q1 form the first current source G1, which drives LEDs 1-5. Mosfet M2, resistor R2 and transistor Q2 form the second current source G2, which drives LEDs 1-9. Mosfet M3, resistor R3 and transistor Q3 form the third current source G3, which drives LEDs 1-12. Mosfet M4, resistor R4 and transistor Q4 form the fourth current source G4, which drives LEDs 1-14. Mosfet M5 and resistor R5 form the fifth current source G5, which drives LEDs 1-15.

Figure 9:
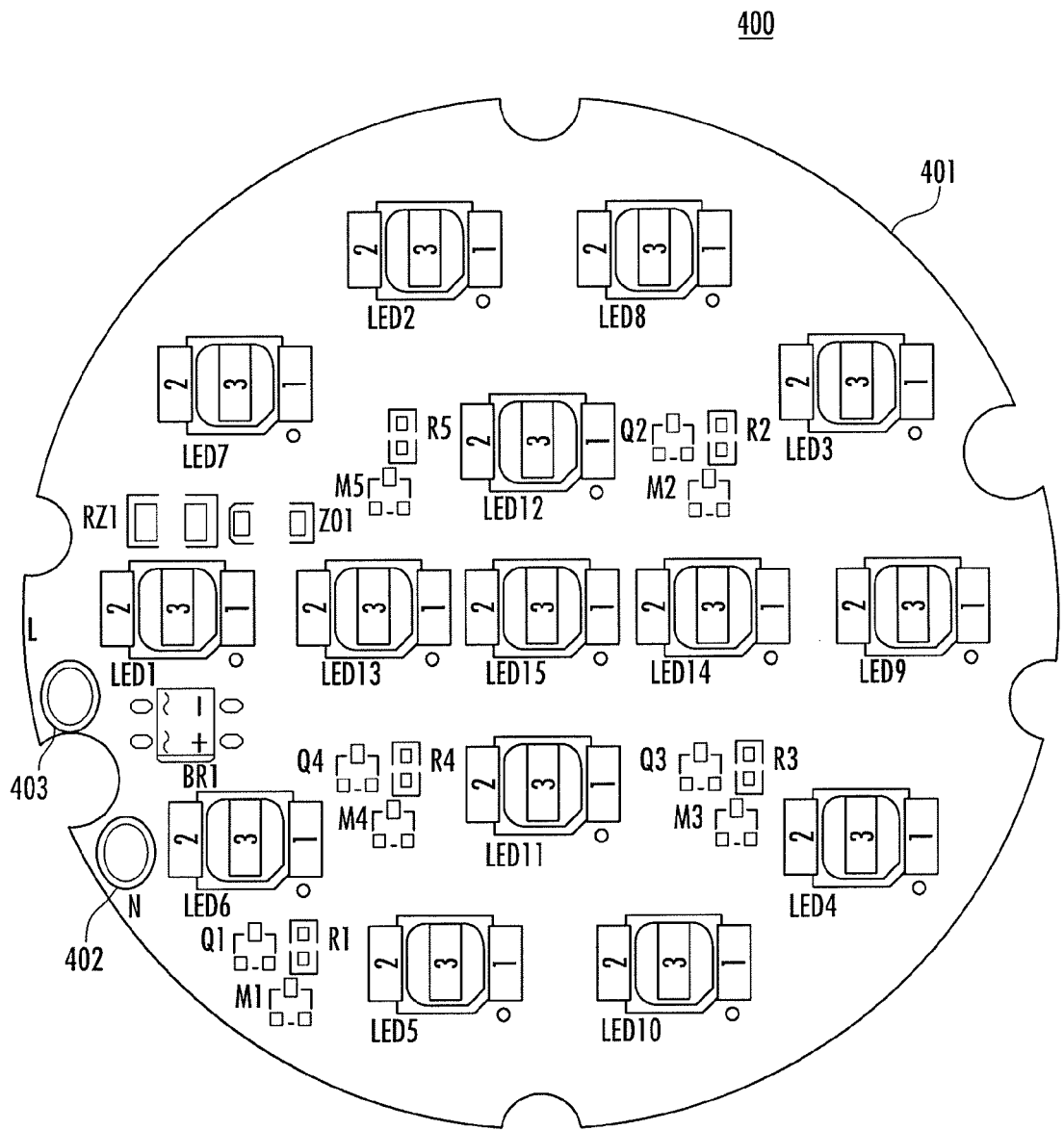
FIG. 9 is a diagram of a circular PCB layout of the circuit shown in FIG. 8.

FIG. 9 shows an example of a preferred circular PCB layout 400 of the circuit of FIG. 8. In this embodiment, the LEDs and components of the circuit of FIG. 8 are placed on a single PCB 401, and the connections to AC power are labeled as neutral (N) 402 and live (L) 403. In accordance with the illustrated embodiment, the LEDs of a particular array are preferably placed next to LEDs of other arrays, to average the brightness of different arrays. So, for example, in the illustrated embodiment, LED2 of array A1, is placed close to LED8 of array A2, but A1 is located distally from LED4 of array A1.

To achieve optimal thermal performance, the PCB area for placing LEDs and components of current sources should preferably be in proportion with the amount of heat they dissipate. For example, if 85% of heat is dissipated in the LEDs and the remaining 15% of heat is dissipated in other components, the PCB area for LEDs should be about 85%, while PCB area for components should be about 15%.

Figure 10:
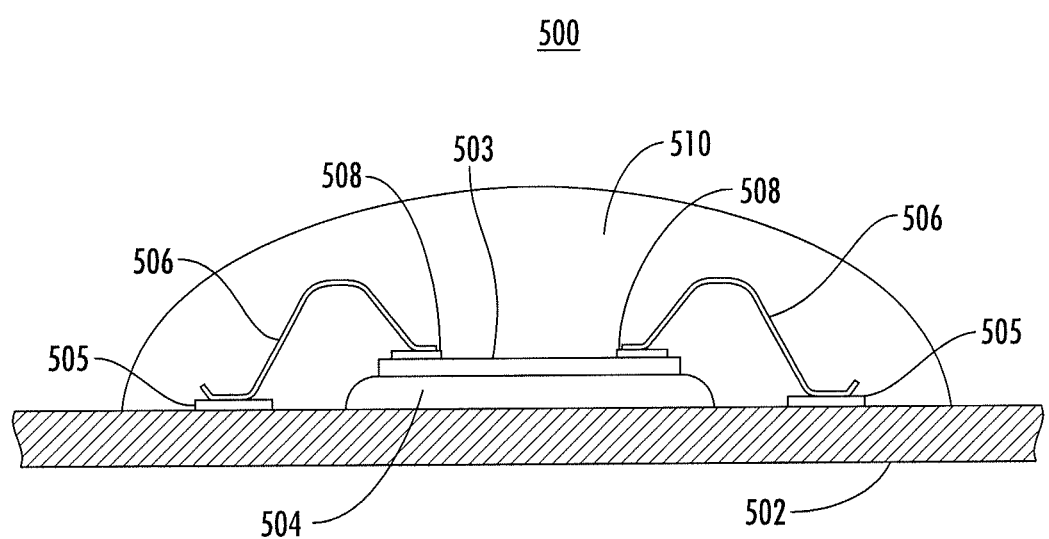
FIG. 10 is an illustration of a direct chip attachment (DCA) assembly.

Instead of undergoing traditional assembly and soldering as an individual PCB, according to one aspect of the present invention, direct chip attachment (DCA) can be used to produce the light engine. In this technique, the LEDs and other components are in the form of semiconductor chips, which are directly mounted on and electrically interconnected to its final circuit board. FIG. 10 shows a DCA assembly example. In the example, a PCB substrate 502 is formed. Each component, whether it be an LED, or an associated component, is formed as a semiconductor chip 503 and affixed to the substrate using thermal adhesive 504. Connections from the chip 503 to the PCB substrate 502 are provided by bond wiring 506, which is attached to the PCB substrate 502 with bond pads 505 and attached to the chip 503 with chip bond pads 508. Preferably, the entire circuit is encapsulated in a silicone encapsulant 510, which, for example can function to keep moisture and dirt away from the chip and associated connections, and to make the circuitry less susceptible to mechanical and chemical damage.

Aside from conventional printed circuit boards, various substrates may be used in making the LED light engine in accordance with the present invention. For example, ceramic and glass ceramic substrates, which exhibit excellent dielectric and thermal properties, may be used. Another option are organic substrates, which weigh and cost less while providing a low dielectric constant. In addition, flex substrates, which, being pliable, have the ability to bend, may be employed in accordance with another advantageous aspect of the present invention.

By applying the die attaching adhesive 504 to the substrate 502, a plurality of LED and component chips 503 are mounted on the substrate 502 to form a complete driving circuit. A curing process, such as exposure to heat or ultraviolet light, follows, which allows the thermal adhesive 504 to attain its final mechanical, thermal, and electrical properties, and electrical connections are made by wirebonding, in the manner shown in FIG. 10 for a single chip.

The wirebonding process used according to this aspect of the present invent is similar to that used in traditional semiconductor assembly, and thermosonic Au ball bonding or ultrasonic Al wedge bonding may be employed to connect wires between dies and the substrate. Finally, as described above, the die and bond wires and the other components are encapsulated to protect them from mechanical and chemical damage.

Figure 11:
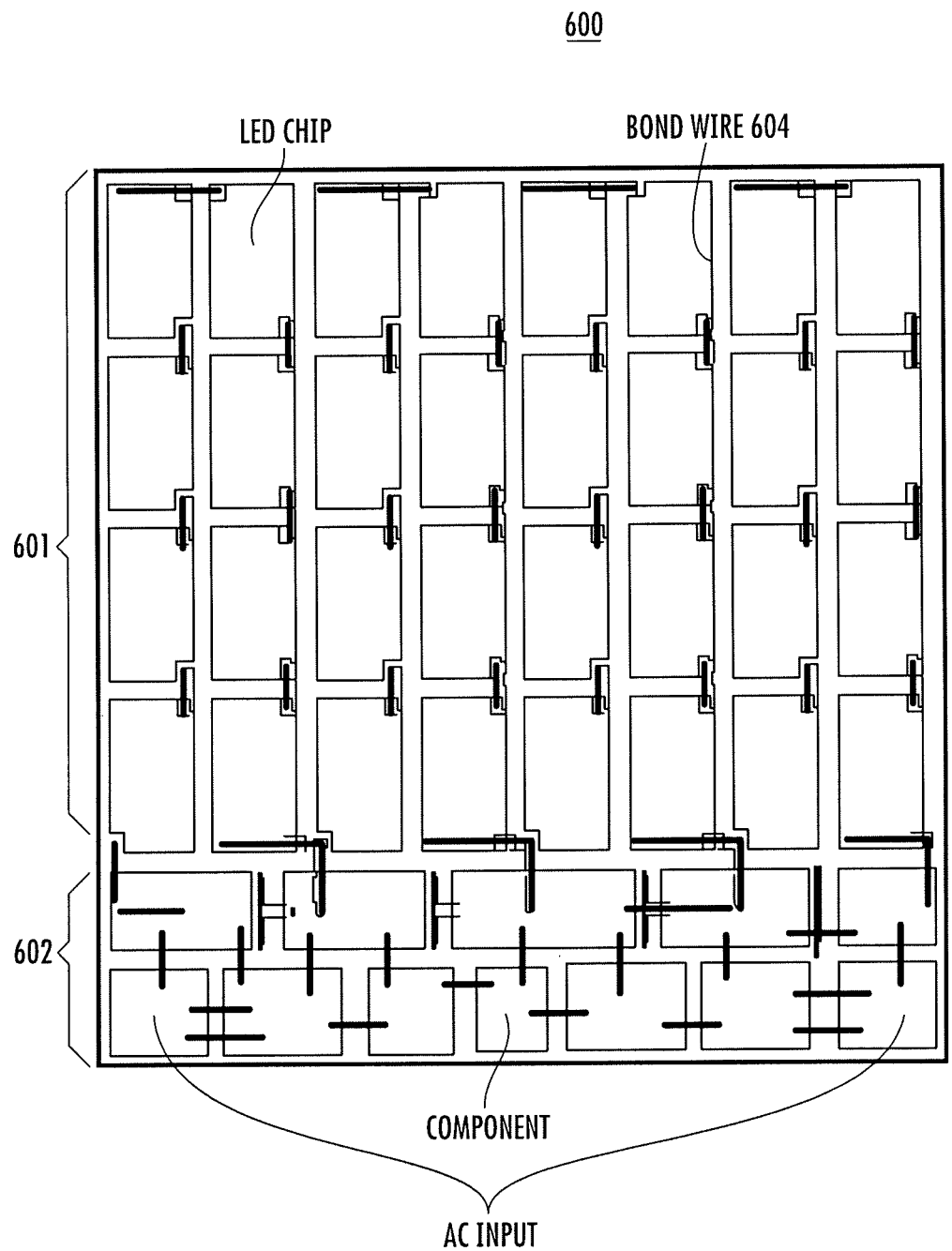
FIG. 11 is an example of a light engine in accordance with an aspect of the present invention using a DCA assembly.

FIG. 11 shows one example of DCA layout of the light engine. In the illustrated example, the LED chips placed in region 601 and are wire bonded, using bond wire 604 to form a high voltage string of LED arrays. The other components, i.e., the rectifiers and current sources, are placed on region 602 of the assembly and wire bonded to the LED arrays. In such a configuration, a simple AC power connection is all that required to power up the light engine.

Although specific embodiments have been illustrated and described herein, it will be appreciated by those of ordinary skill in the art that a variety of alternate and/or equivalent implementations may be substituted for the specific embodiments shown and described without departing from the scope of the present invention. This provisional application is intended to cover any adaptations or variations of the specific embodiments discussed herein. Therefore, it is intended that this invention be limited only by the claims and the equivalents thereof.

What is claimed is:

1. An LED array switching apparatus, comprising, on a single PCB substrate:
   a plurality of LED arrays (D1 to Dn) connected in series, each LED array having a forward voltage;
   an AC voltage supply coupled to the plurality of LED arrays; and
   a plurality of constant current sources (G11 to Gn), coupled to output cathodes of LED arrays (D1 to Dn), respectively, each of the constant current sources being switchable between a current regulating state and an open state such that as the voltage of the AC voltage supply increases, LED arrays are switched on and lit to form a higher forward voltage LED string, and as the voltage of the AC voltage supply decreases, LED arrays are switched off and removed from the LED string starting with the most recently lit LED array, wherein the plurality of constant current sources (G11 to Gn) are directly coupled to the output cathodes of LED arrays (D1 to Dn), respectively.

2. The LED array switching apparatus according to claim 1, wherein the plurality of LED arrays and the plurality of constant current sources are formed as semiconductor chips, and the semiconductor chips are affixed to the PCB substrate by direct chip attachment (DCA).

3. The LED array switching apparatus according to claim 2, wherein the semiconductor chips are affixed to the PCB substrate using thermal adhesive.

4. The LED array switching apparatus according to claim 2 or 3, wherein an electrical connection between the semiconductor chips and the PCB substrate is provided by bond wiring.

5. The LED array switching apparatus according to claim 4, wherein the bond wiring is by thermosonic Au ball bonding.

6. The LED array switching apparatus according to claim 4, wherein the bond wiring is by ultrasonic Al wedge bonding.

7. The LED array switching apparatus according to claim 2, further comprising an encapsulant encapsulating at least the semiconductor chips.

8. The LED array switching apparatus according to claim 2, wherein the PCB substrate area for placing semiconductor chips for the LED arrays and the PCB substrate area for placing semiconductor chips for constant current sources are set in proportion to the amount of heat dissipated by the respective types of semiconductor chips.

9. The LED array switching apparatus according to claim 1, wherein LEDs of a particular array are placed next to LEDs of other arrays.

10. The LED array switching apparatus according to claim 1, wherein the PCB substrate is formed from a material in the group consisting of ceramic, glass, organic and flex substrates.

11. The LED array switching apparatus according to claim 1, wherein the LED arrays (D1 to Dn) and the constant current sources (G1 to Gn) are disposed on the PCB substrate based on an amount of heat dissipated by the LED arrays (D1 to Dn) and an amount of heat dissipated by the constant current sources (G11 to Gn).

12. The LED array switching apparatus according to claim 1, wherein no more than two of the constant current sources (G11 to Gn) are switched to the current regulating state during a supply of the voltage by the AC voltage supply.

13. The LED array switching apparatus according to claim 1, wherein the output cathodes of the plurality of LED arrays (D1 to Dn) are connected to input anodes of immediately subsequent ones of the plurality of LED arrays (D1 to Dn).

14. The LED array switching apparatus according to claim 1, wherein the output cathodes of the plurality of LED arrays (D1 to Dn) are directly connected to the input anodes of immediately subsequent ones of the plurality of LED arrays (D1 to Dn).

15. An LED array switching apparatus, comprising, on a single PCB substrate:
   a plurality of LED arrays (D1 to Dn) connected in series, each LED array having a forward voltage;

an AC voltage supply coupled to the plurality of LED arrays; and a plurality of constant current sources (G11 to Gn), coupled to output cathodes of LED arrays (D1 to Dn), respectively, each of the constant current sources being switchable between a current regulating state and an open state such that as the voltage of the AC voltage supply increases, LED arrays are switched on and lit to form a higher forward voltage LED string, and as the voltage of the AC voltage supply decreases, LED arrays are switched off and removed from the LED string starting with the most recently lit LED array, wherein nodes formed by connections of the output cathodes of the plurality of LED arrays (D1 to Dn) to input anodes of immediately subsequent ones of the plurality of LED arrays (D1 to Dn) are coupled to the plurality of constant current sources (G11 to Gn), respectively.

16. An LED array switching apparatus, comprising, on a single PCB substrate:

a plurality of LED arrays (D1 to Dn) connected in series, each LED array having a forward voltage;

an AC voltage supply coupled to the plurality of LED arrays; and a plurality of constant current sources (G11 to Gn), coupled to output cathodes of LED arrays (D1 to Dn), respectively, each of the constant current sources being switchable between a current regulating state and an open state such that as the voltage of the AC voltage supply increases, LED arrays are switched on and lit to form a higher forward voltage LED string, and as the voltage of the AC voltage supply decreases, LED arrays are switched off and removed from the LED string starting with the most recently lit LED array, wherein nodes formed by connections of the output cathodes of the plurality of LED arrays (D1 to Dn) to input anodes of immediately subsequent ones of the plurality of LED arrays (D1 to Dn) are directly coupled to the plurality of constant current sources (G11 to Gn), respectively.

* * * * *